United States Patent [19]

Mehta et al.

[11] 4,038,646

[45] July 26, 1977

[54] DYNAMIC MOS RAM

[75] Inventors: Rustam Mehta, Sunnyvale; Stephen F. Dreyer, San Jose, both of Calif.

[73] Assignee: Intel Corporation, Santa Clara, Calif.

[21] Appl. No.: 666,338

[22] Filed: Mar. 12, 1976

[51] Int. Cl.[2] .............................................. G11C 11/04
[52] U.S. Cl. .............................................. 340/173 R
[58] Field of Search ..................... 340/173 R, 173 CA; 320/1; 307/238, 279

[56] References Cited

U.S. PATENT DOCUMENTS

| | | | |
|---|---|---|---|
| 3,922,647 | 11/1975 | Broeker, Jr. | 340/173 R |
| 3,959,781 | 5/1976 | Mehtz et al. | 340/173 R |
| 4,004,285 | 1/1977 | Bormann et al. | 340/173 R |

*Primary Examiner*—Vincent P. Canney

*Attorney, Agent, or Firm*—Blakely, Sokoloff, Taylor & Zafman

[57] ABSTRACT

An improved dynamic MOS RAM employing capacitive storage memory cells having a single active device per cell. The RAM includes several improved circuits and techniques which reduce power consumption and pattern sensitivity and which also provide a higher speed memory. Complementary input/output lines are employed which are coupled to alternate pair of the bit-sense lines making the use of a bistable output latch and push-pull output buffer more advantageous. The sense amplifiers associated with each of the bit lines are activated by a dual sloped signal to reduce noise and increase sensitivity and gain in the amplifiers. The output lines of the address buffers are initially "high" and then brought to their final level after an address is received by the buffers.

24 Claims, 8 Drawing Figures

C GENERATOR

SENSE AMP

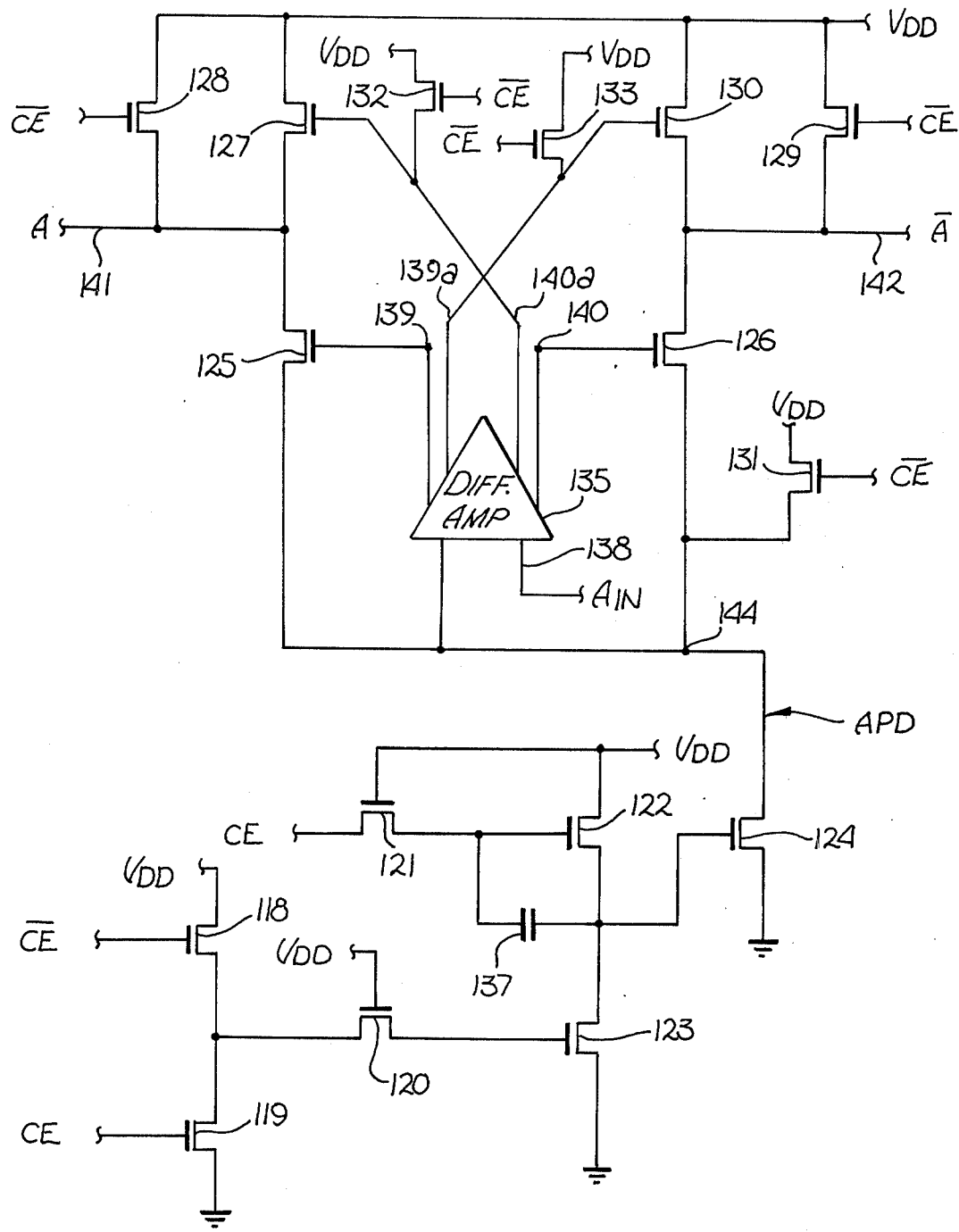
ADDRESS BUFFER  Fig. 7

DYNAMIC MOS RAM

BACKGROUND OF THE INVENTION

1. Field of the Invention

The invention relates to the field of dynamic MOS RAMS.

2. Prior Art

Metal-oxide-semiconductor (MOS), integrated circuit memories including random-access memories (RAMS) are known in the art. These memories are fabricated utilizing known MOS technology with the entire memory fabricated on a single silicon substrate. Such memories are typically either static or dynamic. The static RAMS generally employ bistable circiuts, such as flip-flops for memory cells. Such circuits require a number of devices, for example, several field-effect transistors, for each cell. The dynamic RAMS often employ memory cells which rely upon capacitive storage. These memories require periodic refreshing since the capacitive storage is transient. To obtain a higher density RAM the presently disclosed RAM, in addition to some prior art RAMS, utilizes memory cells having a single active device for each cell. This device is generally a field-effect transistor which is used to gate or select a capacitive storage means. For an example of a prior art use of single active device memory cells, see U.S. Pat. No. 3,533,089.

One method of producing more economical memories is to increase density such that for a given area of substrate more storage is provided. However, as the device density increases, power consumption per bit of storage becomes more critical and moreover, for single active device cells, moise becomes more of a problem.

In some dynamic MOS RAMS which employ a single active device for each memory cell, a single input/output bus is employed. This bus is coupled to all the bit-sense lines in the array through the row decoders. The use of a single input/output bus while simplifying the chip architecture, provides inherent noise rejection problems. An example of one such memory employing a single input/output bus is disclosed in co-pending application Ser. No. 520,797 filed Nov. 4, 1974 now U.S. Pat. No. 3,959,781. and assigned to the assignee of this application. In the presently disclosed memory a pair of input/output lines are employed which are coupled to alternate pairs of the bit-sense lines. This provides additional advantage through the use of a bistable input/output latch with a differential amplifier and push-pull buffer to provide better noise rejection.

In MOS RAMS employing single active device memory cells, the bit-sense lines of the array are often bisected with bistable sense amplifiers. It is known in the prior art that the effectiveness of these amplifiers may be increased by delaying conduction through the amplifier loads after the amplifier has been activated. In this manner the loads present very high impedance, thus providing higher gain. A MOS RAM employing such a technique is disclosed in co-pending application Ser. No. 569,927 filed Apr. 21, 1975, now U.S. Pat. No. 3,978,459 assigned to the assignee of this application. In the presently disclosed MOS RAM the sense amplifiers are activated with a signal having a dual slope to provide improved noise rejection and gain. This is accomplished by activating the pull-down devices of the sense amplifier to a lesser extent during the first slope while the pull-up devices are in the high impedance mode, thus facilitating high gain, lower power operation of the sense amplifier. During the second slope the pull-down devices on the sense amplifier conduct more heavily, at the same time the pull-up devices are driven into a higher conduction range. This changes the sense amplifier mode to lower gain, high power operation. Hence, the same devices provide the high gain requirement during the initial stage of the operation, and high drive capability after the basic signal has been sensed.

The MOS RAM of the present invention employs several other novel circuits and techniques to provide a higher speed MOS RAM which consumes less power and which has improved noise and pattern sensitivity characteristics.

SUMMARY OF THE INVENTION

A dynamic metal-oxide-semiconductor, random-access memory is described. The memory includes a plurality of storage cells which are disposed along a plurality of bit-sense lines. A bit-sense amplifier whih includes a bistable circuit and a pair of load devices is coupled to each of these bit-sense lines. A generator means is coupled to each of the bit-sense amplifiers to activate these amplifiers. This generator means generates an output signal which has a first slope for a predetermined period followed by a second, steeper slope. In this manner, the bit-sense amplifiers provide the high gain and the drive capability as and when necessary.

BRIEF DESCRIPTION OF THE DRAWINGS

FIG. 7 is a schematic of an address buffer employed in the memory;

FIG. 9 is a schematic of the $\phi_w$ and SAS generator employed in the memory.

DETAILED DESCRIPTION OF THE INVENTION

Figure 1:
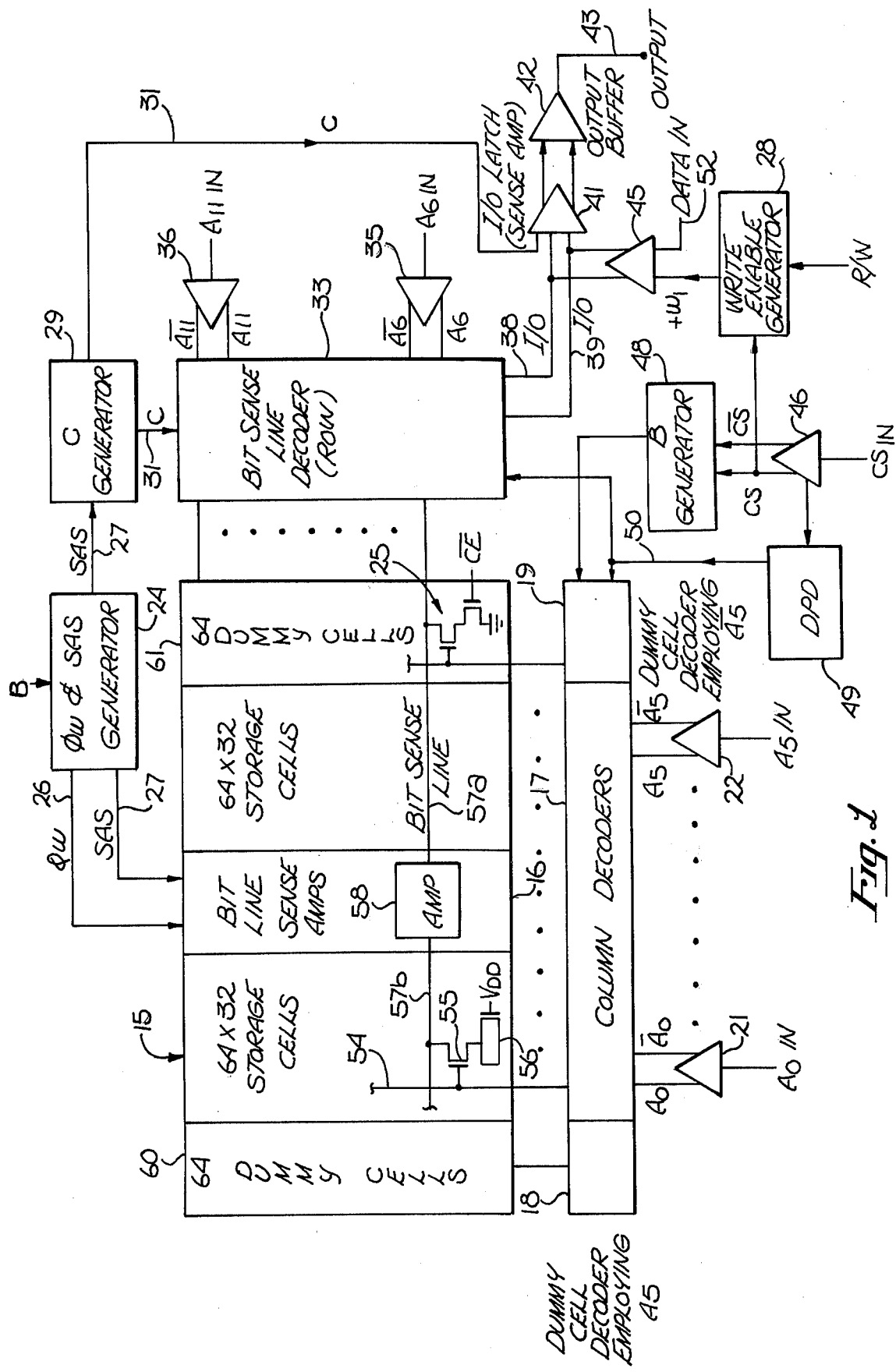
FIG. 1 is a general block diagram of the disclosed MOS RAM.
Figure 2:
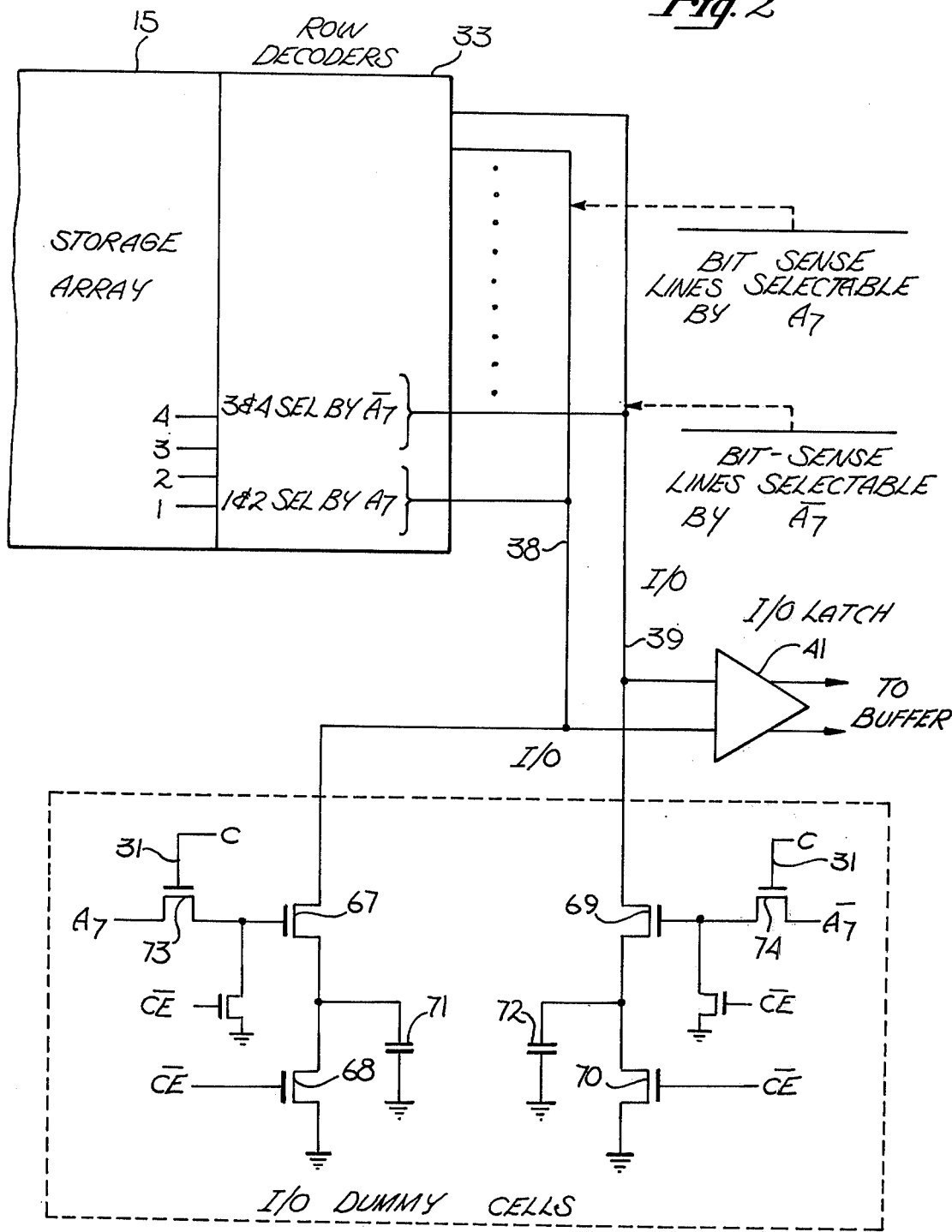
FIG. 2 is a block diagram and schematic of a portion of the memory of FIG. 1. This figure is used to describe the complementary input/output lines and the input/out dummy cells employed with these lines.
Figure 3:
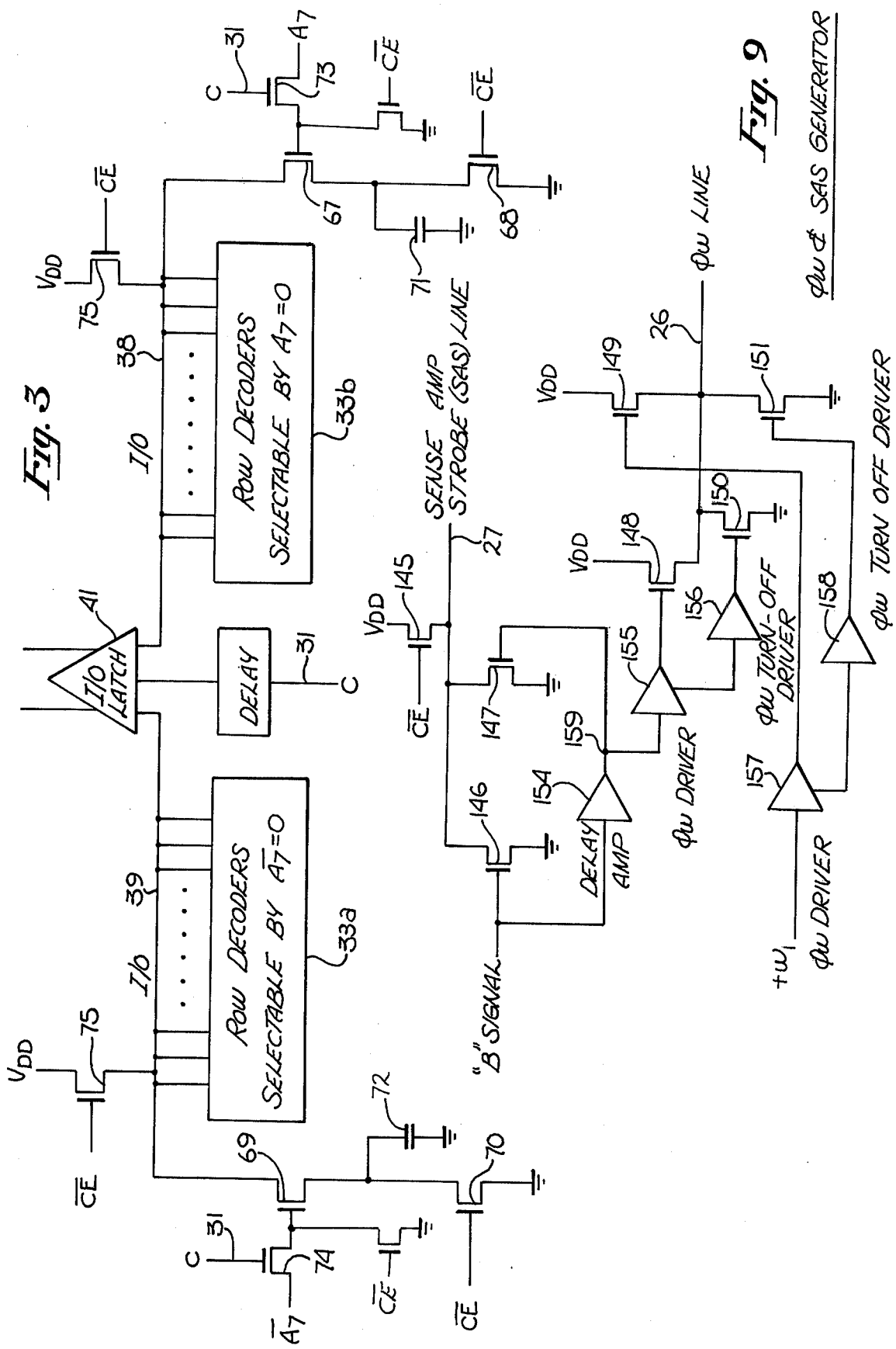
FIG. 3 is a partial block diagram and schematic of a portion of the memory of FIG. 1. In this figure, the row decoders have been separated into tow blocks to illustrate the manner in which the bit-sense lines are coupled to the input/out lines.
Figure 4:
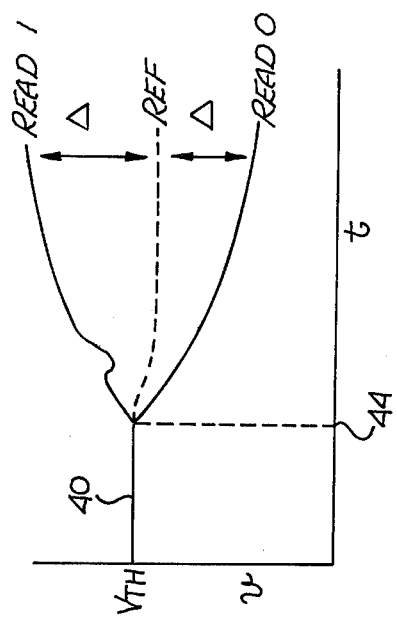
FIG. 4 is a graph which illustrates the potentials on the input/output lines during a read cycle.

A metal-oxide-semiconductor (MOS) random-access memory (RAM) is described. This dynamic memory employs capacitive storage in memory cells, each memory cell includes a single active device. Numerous details of the presently preferred embodiment of the memory are set forth below for the purposes of providing a complete understanding of the inventions. However, as will be appreciated, other memories may be fabricated employing the disclosed inventions without utilizing some of these specific details in this application. In some instances well known circuits and techniques employed in dynamic MOS RAMS have not been included in this application in order not to obscure the inventions in detail.

In the presently preferred embodiment the integrated circuit MOS RAM is deployed on a p-type silicon substrate of approximately 123 × 185 mils. As presently realized the memory is a 4K (4096 bits) memory employing n-channel fieldeffect transistors having polycrystalline silicon gates. Worse case access times of 200 nanoseconds are realized with worse case power comsumption of 700 milliwatts for the entire memory.

The memory performs standard read-write functions and read-modify write functions in a manner known in the art. The memory includes refresh means for refreshing the information stored in the memory cells as is well known in the art.

As presently implemented the memory employes a 12 volt positive potential as the primary power for the memory, this potential is referrred to as $V_{DD}$ in the specification. In some embodiments of the memory a secondary potential of +5 volts is also employed. The ground potential ($V_{SS}$) is illustrated in the drawings with use of a standard grounding symbol. Substrate biasing of −5 volts is utilized in the presently preferred embodiment. An input timing signal or chip enable signal (CE) having a period of approximately 350 nanoseconds is externally generated and applied to the memory. This signal may be a high level clocking signal or may be a TTL compatible signal where the memory includes driving means for providing a 12 volt CE signal for use by the memory. Other inputs to the memory include a chip select signal (CS) and a read/write signal (R/W).

In FIG. 1, the general block diagram of the MOS RAM, the storage array 15 is divided into two equal groups of storage cells, each including a 64 × 32 bit matrix. A memory cell is coupled between each transverse line in this matrix; one such cell is shown coupled to the crossover between column line 54 and bit-sense line 57b. This cell includes a gating or control device 55 which comprises an MOS field-effect transistor having its gate coupled to the column line 54 an its drain coupled to the bit-sense line 57b. The capacitive storage means 56 for the cell includes a diffused region in the substrate and a gate which is coupled to the source of the $V_{DD}$ potential. A column of bit line sense amplifiers 16 bisects the bit-sense lines of the array such that each bit-sense sense line includes two segments shown, by way of example, as lines 57a and 57b coupled to an amplifier 58. Each of the 64 bit-sense lines in the array are coupled to an amplifier such as amplifier 58 in a similar manner. The amplifier 58 shall be discussed in more detail in conjunction with FIG. 6.

Two columns of dummy cells are disposed on the opposite sides of the memory cells, specifically 64 dummy cells 60 are disposed on the left-hand side of the array 15 and sixty-four dummy cells 61 are disposed along the right-hand side of the array 15. Each of the sixty-four bit-sense lines in the right-hand portion of the array, such as line 57a, is coupled to a dummy cell, such as dummy cell 25. Similarly, each line in the left-hand side of the array, such as bit-sense 57b, is coupled to one dummy cell within dummy cells 60. Each dummy cell comprises a pair of field-effect transistors coupled in series between its respective bit-sense line and ground, as illustrated by dummy cell 25. When a memory cell on the left-hand side of the array has been selected, the dummy cells 61 are coupled to the bit-sense lines on the right-hand portion of the array to add a predetermined fixed signal to these lines, as is well known in the art. Similarly when a memory cell is selected on the left-hand portion of the array, dummy cells 60 are coupled to the bit-sense lines.

Information is read into, and from, the array 15 through the bit-sense line decoders 33. The decoders 33 operate in a known manner to decode the portion of the address which selects a bit-sense and couples the selected bit-sense line to one of the two input/output lines 38 or 39. The decoders 33 receive the address signals designated $A_6IN$ through $A_{11}IN$ after these signals have been buffered through address buffer, such as buffers 35 and 36. These address buffers shall be described, in detail, in conjunction with FIG. 7. Each buffer, however, has an output which comprises the "true" input to the buffer and its complement; for example, for buffer 35, the input signal is shown as $A_6IN$ and the output from the output from the buffer is shown as $A_6$ and $\overline{A_6}$.

Since each of the bit line sense amplifiers includes a bistable circuit, the complement of the input data is stored in the left-hand portion of the array 15. For example, if the memory cell comprising transistor 55 and capacitive means 56 is selected and a binary "one" is applied to the bit-sense line 57a, this signal after passing through amplifier 58 is stored in the form of a binary "zero" in the memory cell. However, when this signal is read from the cell, it again it inverted as it passes through amplifier 58 and is read from the memory as a binary "one".

The bit line sense amplifiers 16 are controlled by signals generated within the $\phi_w$ and SAS generator 24. The $\phi_w$ signal is communicated to all the amplifiers 16 on line 26 while the sense amplifier strobe (SAS) signal is communicated to these amplifiers by line 27. The function of these signals, and their waveforms, shall be discussed in detail in conjunction with FIGS. 6 and 8; the $\phi_w$ and SAS generator 24 shall be described in detail in conjunction with FIG. 9.

Figure 5:
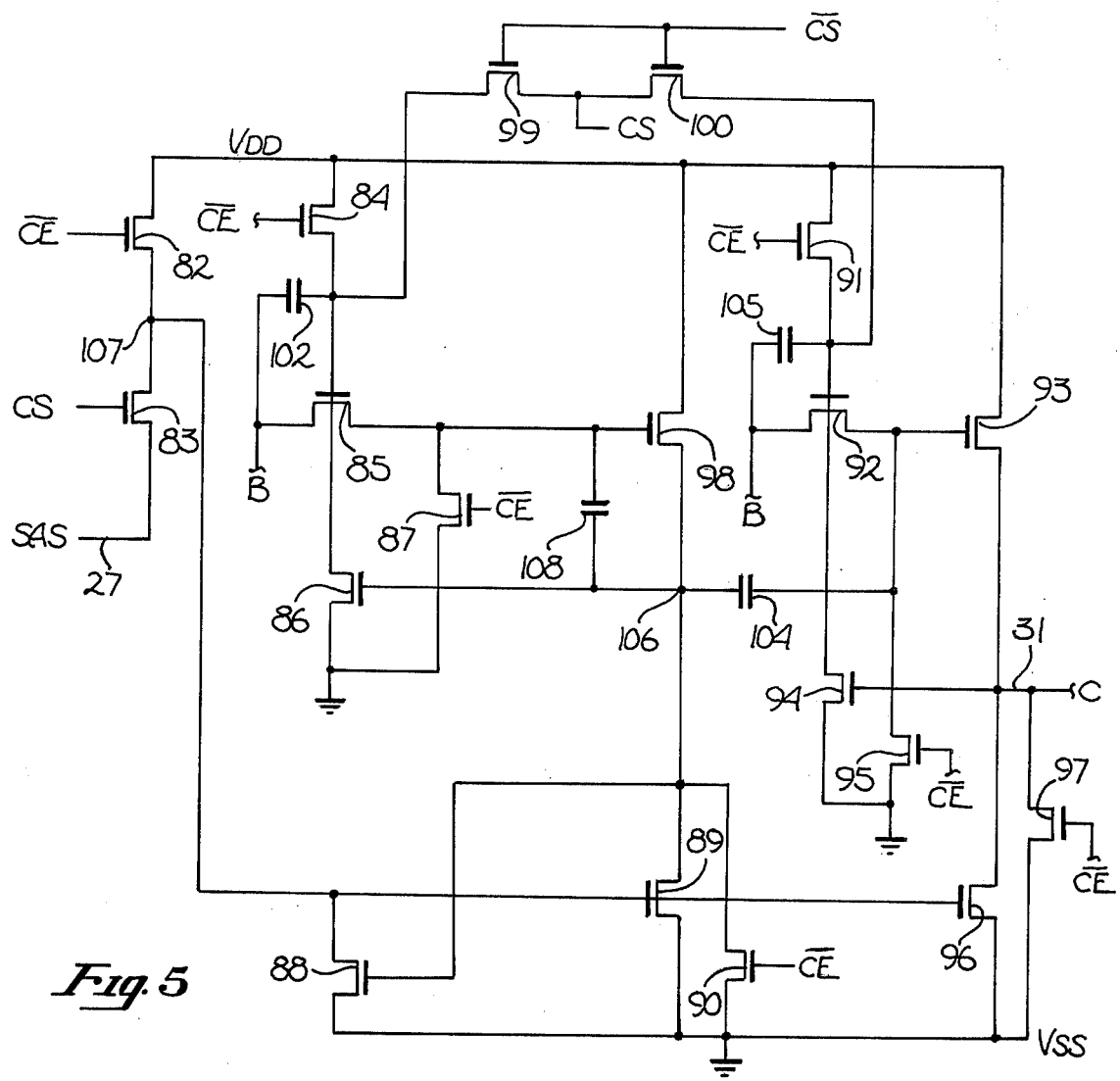
FIG. 5 is a schematic of the generator employed in the memory of FIG. 1. This generator which employs unique bootstrapping means is used to conserve power in the decoders.

The "C" generator generates a "C" signal which is applied to the decoder 33 and to the input/outpt (I/O) latch 41 via line 31. In the decoders, this "C" signal is used to activate the transistor which couples the selected bit-sense line with an I/O line, after the sensing on the bit-sense is completed. In this manner power is conserved within the decoder 33. The generator 29 shall be described in detail in conjunction with FIG. 5 particularly since this generator includes unique bootstrapping means.

The input/output lines 38 and 39 are coupled to an I/O latch (sense amplifier) 41. This sense amplifier comprises a bistable circuit, the output of which is communicated to a push-pull output buffer 42. The memory includes a signle output line 43 coupled to the output terminal of this output buffer 42. Input data and the complement of input data are applied to the I/O lines 38 and 39 by an amplifier 45. The inputs to this amplifier include the external data-in signal, line 52, and an write-enable pulse, $+W_1$, which signal is generated by the write-enable generator 28. The write-enable generator 28 receives the external R/W signal, and a chip select (CS) signal from amplifier 46 which signals are used to generate the writing strobe, $+W_1$. The generator 28 may be fabricated from well known circuits and performs a known function.

The externally applied chip select signal ($CS_{IN}$) is applied to the input terminal of amplifier 46. Amplifier 46 generates an addreess pull-down (APD) signal in addition to a CS signal and its complement, which signals are applied to various circuits in the memory including the "B" generator 48 and the decoder pull-down (DPD) generator 49. The "B" generator 48 generates a power saving signal similar to the "C" signal generated by generator 29, this signal is applied to the column decoders 17. The DPD generator 49 generates a signal which pulls-down the column and row decoders after the input address is valid. The output of this generator is applied to the source terminals of the decoding transistors in the decoders through line 50 and couples these transistors to ground after the address buffers have processed an address. This again is done to conserve power within the decoders and prevent unnecessary conduction of the decoding transistors. This is particularly necessary since in the presently preferred embodiment, the output lines of the address buffers (including both the "true" and its complement) are maintained at a threshold below $V_{DD}$ until the buffer is set. Once the buffer is set, one line is then raised to $V_{DD}$ while the other line is brought to ground potential. This feature of the address buffers shall be discussed in detail in conjunction with FIG. 7.

A plurality of column decoders 17 are coupled between the column address buffers and the column lines in the array. These column decoders receive the address signals $A_0$ through $A_5$ and their complements, decode these signals and then apply a potential ($V_{DD}$) to the selected column line. This decoding is performed in a known manner by the decoders 17. Two of the six column buffer amplifiers are illustrated, specifically buffers 21 and 22. The address buffer 21 receives the external $A_0$ IN signal and the communicates the $A_0$ and $\overline{A_0}$ signals to the decoders. Similarly the address buffer 22 receives the $A_5$ IN signal and generates the $A_5$ and $\overline{A_5}$ signals for the decoders.

As presently implemented the column decoders 17 are arranged such that a cell in the right-hand portion of array 15 is selected when the $A_5$ signal is low, and a cell in the left-hand side of the array is selected when the $\overline{A_5}$ signal is low. The dummy cell decoder 18 provides a signal to the dummy cells 60 when $A_5$ is low, thus when a storage cell is selected in the right-hand side of the array, the dummy cells on the left hand side of the array are coupled to the bit-sense lines. Similarly, when the $\overline{A_5}$ signal is low indicating that a storage cell has been selected on the left-hand side of the array, the dummy cell decoder 19 generates a positive signal which is coupled to the dummy cells 61, thereby assuring that the dummy cells are coupled to the right-hand portion of the bit-sense lines. As will be appreciated, the use of the signal $A_5$ and $\overline{A_5}$ for the dummy cell decoders is not critical, that is, other column address signals may be used for these dummy cell decoders where the array and decoders are appropriately configured. The use of dummy cells decoders and the dummy cells for applying a predetermined load to the bit-sense lines is known in the prior art.

SENSE AMPLIFIER

Figure 6:
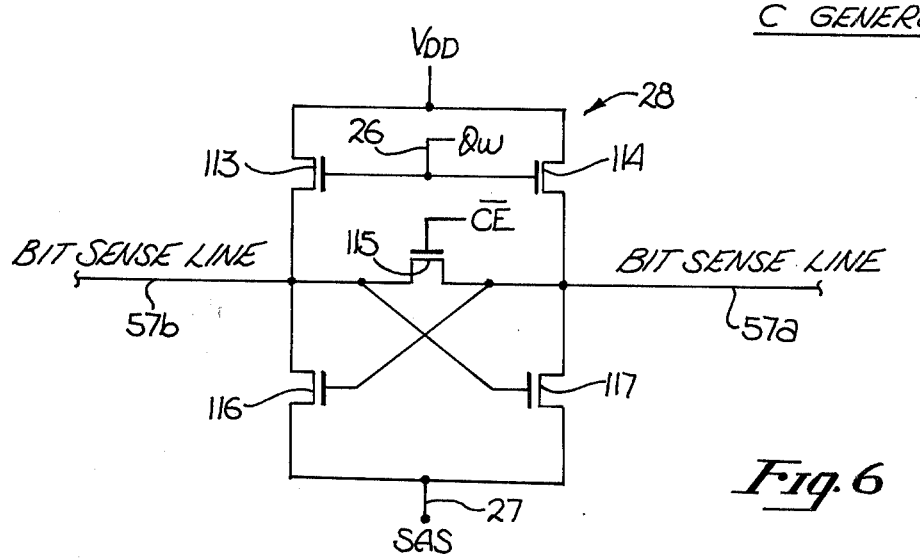
FIG. 6 is a schematic of the bit-sense amplifier shown in block diagram form in FIG. 1.

Referring now to FIG. 6 the sense amplifier 58 of FIG. 1 is shown in detail. This bistable circuit includes a first leg comprising transistors 113 and 116 coupled in series between $V_{DD}$ and the source of the SAS signal, line 27. The second leg of this amplifier comprises transistors 114 and 117 again coupled in series between $V_{DD}$ and line 27. The common terminal between transistors 113 and 116 is coupled to one segment of the bit-sense line, line 57b, the gate of transistor 117 and one terminal of transistor 115. The common terminal between transistors 114 and 117 is coupled in a symmetrical fashion to the line 57a, the gate of transistor 116 and the other terminal of transistor 115. The gate of transistor 115 is coupled to the source of the $\overline{CE}$ signal, thus during the period of time that the chip enable signal is low, the potential on lines 57a and 57b is equalized through transistor 115. The load transistors 113 and 114 have their gates coupled to line 26, the $\phi_w$ signal. Prior to the time that the amplifier senses the state of a cell along either line 57a or 57b, both of these lines are precharged through pull-up transistors, not illustrated.

Figure 8:
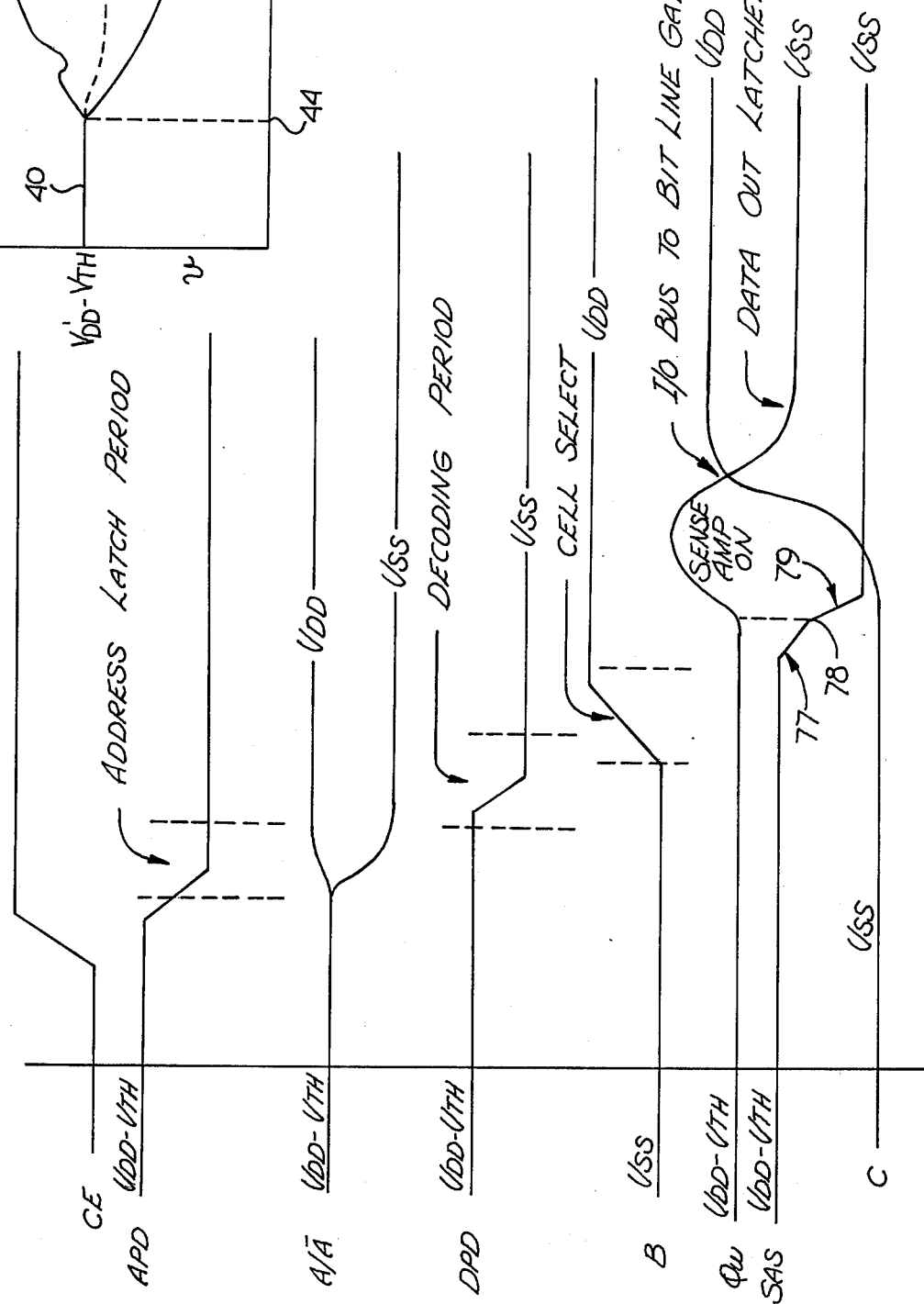
FIG. 8 is a graph illustrating the waveforms of various signals associated with the operation of the memory.

Referring to FIG. 8 the waveforms of the $\phi_w$ signal and the SAS signal are shown. The $\phi_w$ signal and the SAS signal are initially maintained at a potential of $V_{DD}$ less a voltage threshold of a field-effect transistor by the generator 24 of FIG. 1. As indicated by the other waveforms in FIG. 8, after the CE signal becomes positive, the address buffers are then activated. Following this the decoder pull-down (DPD) signal drops to $V_{SS}$ during the decoding period allowing the decoders to decode the address. Then, the "B" signal rises to $V_{DD}$ allowing a column line to be selected within the array 15. The potentials on the $\phi_w$ and SAS line then begin to change to permit sensing of cells along this line.

The SAS signal first begins to decay towards $V_{SS}$ at a slope 77 for a predetermined period ending at time 78. After time 78 the SAS signal decays at a greater rate, that is, at a steeper slope 79 until this signal approximately reaches $V_{SS}$ potential. The $\phi_w$ signal remains at the $V_{DD}$ minus a voltage threshold until time 78, at which time this signal begins to increase to $V_{DD}$. The signal remains at the $V_{DD}$ level for sufficient time to allow the sensed state of the selected cell to be transmitted to the input/output latch and for a "one" to be refreshed. The $\phi_w$ signal is then brought to $V_{SS}$ potential to conserve power within the sense amplifiers. During a read-modified write cycle the $\phi_w$ signal returns to the $V_{DD}$ level during the write portion of the cycle. Thus, during the read-modified write cycle power is conserved within the sense amplifier between the read portion and write portion of the cycle. After the write portion of the cycle the $\phi_w$ signal is again brought down to $V_{SS}$ to conserve power in the sense amplifiers.

Assume that a cell along line 57b (FIG. 6) has been selected and that the state of this cell is to be determined, that is, read. When this selected cell is activated by the column line, a dummy cell will be coupled to bit-sense line 57a as previously discussed. Initially, with both the SAS and $\phi_w$ signals at $V_{DD}$ less a threshold, the amplifier is off and the load transistors 113 and 114 do not conduct. As the SAS signal begins to decay towards $V_{SS}$ (prior to time 78) the amplifier is activated, however, during this period, the load transistors 113 and 114 still do not conduct. These load devices since they are not conducting have a relatively high impedance, thus, the amplifier 58 during this period has a high gain. The noise generated by the activation of the amplifier 58 is a function of the rate at which the amplifier is activated, that is, a function of the decay time of the SAS signal. The slope 77 of the SAS signal (since it is less than slope 79) tends to reduce the noise associated with the activation of amplifier 58. Therefore, prior to time 78 the amplifier has high gain with low noise, however, the means comprises transistors 91, 92, 94 and 95, and capacitor 105 which are used to bootstrap capacitor 104.

The transistors 82, 83, 88, 89 and 98 define a time delay circuit in the flip-flop configuration for determining the time delay between the "C" signal and the SAS signal.

The transistors 99 and 100 are used to prevent a potential from being applied to the gates of transistors 93 and 98 to conserve power when the chip is not selected. Note that the "C" signal is not reuired except when the chip is selected, that is, this signal is not required for refreshing.

In the first bootstrapping means transistor 84 is coupled in series with transistor 86 between $V_{DD}$ and ground. The common terminal between these transistors is coupled to the gate of the transistor 85 and one terminal of capacitor 102. The drain terminal of transistor 85 is coupled to the source of the "B" signal and to the other terminal of capacitor 102. The source terminal of transistor 85 is coupled to the drain terminal of transistor 87, the gate of transistor 98, and one terminal of capacitor 108. Transistor 98 which provides the output (node 106) of this bootstrapping circuit is coupled between $V_{DD}$ and node 106. Node 106 is coupled to ground through the parallel combination of transistors 89 and 90. The gate of transistor 90 along with the gates of transistors 84, 87 and 91 are coupled to the source of the $\overline{CE}$ signal. The gate of transistor 89 is coupled to the common terminal between transistors 82 and 83, the drain terminal of transistor 88 and the gate of transistor 96. The bootstrapping capacitor 108 is coupled between the gate of transistor 98 and node 106.

The boostrapping performed by transistors 84, 85, 86, 87, and 98, and capacitors 102 and 108 is a departure from that used in the prior art. Typically, in the prior art, a capacitor such as capacitor 108 is charged to a potential of $V_{DD}$ less a threshold and the potential on this capacitor is then used to bootstrap the gate of an output transistor such as transistor 98. However, with the bootstrapping circuit employed in the "C" generator of FIG. 5, the capacitor 108 is charged to $V_{DD}$, and hence, the gate of transistor 98 is raised to higher potential. This additional potential on the gate of transistor 98 is particularly valuable when the $V_{DD}$ potential is at its lower limits. For example, where $V_{DD}$ is equal to 10 volts, approximately 25% increase in output voltage is realized with this bootstrapping circuit.

In the operation of this bootstrapping circuit, when $\overline{CE}$ is positive, transistor 84 conducts charging the gate of transistor 85 and capacitor 102. Note that during this period of time the drain terminal of transistor 85 is coupled to ground (See "C" waveform FIG. 8). After the $\overline{CE}$ signal drops in potential and the "B" signal rises to $V_{DD}$, the charge on capacitor 102 bootstraps the gate of transistor 85. This transfers the "B" signal through transistor 85 onto the bootstrapping capacitor 108, thereby charging capacitor 108 to $V_{DD}$. Note that one terminal of capacitor 108 is held at ground potential through transistor 89 since the gate of this transistor (node 106) is precharged through transistor 82 during the period of time that the $\overline{CE}$ signal is positive. When the SAS signal drops in potential node 107 is discharged (assuming that the chip has been selected) causing transistor 89 to cease conducting. When this occurs, node 106 rises in potential and capacitor 108 boostraps the gate of transistor 98. Node 106 then quickly rises to the $V_{DD}$ potential. The rise in potential on node 106 causes transistor 86 to conduct thereby discharging the gate of transistor 85. This is necessary to prevent the increased potential on the gate of transistor 98 from being transferred to the source of the "B" signal through transistor 85.

The second bootstrapping circuit includes transistors 91 and 94 coupled in series between $V_{DD}$ and ground with common terminal between these transistors being coupled to the gate of transistors 92 and one terminal of the capacitor 105. The other terminal of capacitor 105 and the drain of transistor 92 are coupled to the source of the "B" signal. The output transistor 93 is coupled in series with the transistor 96 between $V_{DD}$ and ground. The common terminal between these transistors is coupled to ground through the pull-down transistor 97 and to the gate of transistor 94. Capacitor 104 is coupled between node 106 and the gate of transistor 93, the source terminal of transistor 92 and the drain terminal of transistor 95. The gates of transistors 95, 97 and 91 are coupled to the source of the $\overline{CE}$ signal.

Transistors 91, 92, 93, 94, 95 and 96 along with capacitors 104 and 105 operate as a bootstrapping circuit in the same manner as the previously described bootstrapping circuit. However, instead of capacitor 104 being coupled between the gate of the output transistor 93 and the output line 31, the capacitor is coupled between the gate of transistor 93 and node 106. In this manner the high capacitance associated with the line 31 does not prevent the rapid bootstrapping of the gate of transistor 93.

The time delay between the SAS signal and the "C" signal is determined primarily by a bistable or flip-flop circuit which includes transistors 83 and 88 in one leg and transistors 98 and 89 in the other leg. During the period of time that capacitor 108 is charging, node 106 is at $V_{SS}$ plus the voltage drop associated with transistor 89. As the SAS signal drops in potential the charge on node 107 decreases. Transistor 89 then becomes less conductive while transistor 88 begins to conduct because of the rise in potential on node 106. After the transition occurs, transistor 88 conducts, completely discharging node 107; transistor 89 ceases to conduct allowing node 106 to rise in potential. When node 106 rises in potential the gate of the output transistor 93 is bootstrapped and the "C" signal is generated on line 31. The time delay between the SAS signal and the "C" signal is primarily controlled by the resistance associated with the transistor 83 and the capacitance associated with node 107 which node includes the gates of transistors 89 and 96.

The transistors 99 and 100 are coupled to the gates of transistors 89 and 92 with the common terminal between transistors 99 and 100 being coupled to the source of the $\overline{CS}$ signal. The gates of transistors 99 and 100 are coupled to the source of the CS signal. In this manner when the chip is not selected, the gates of transistors 85 and 92 will be held at ground potential, thereby preventing transistors 93 and 98 from conducting. Power is thus conserved within the "C" generator when the chip has not been selected.

ADDRESS BUFFER

In FIG. 7 the presently preferred embodiment of the address buffer (such as address buffers 21, 22, 35 and 36 of FIG. 1) is shown. Line 138 which is an input to the differential amplifier 135 receives the externally applied address signal $A_{IN}$. The outputs to the buffer are line 141 (A) and line 142 ($\overline{A}$). The buffer is generally a bistable circuit which includes a first leg comprising series transistors 125 and 127 coupled between $V_{DD}$ and node 144, and a second leg which includes series transistors 126 and 130 also coupled between $V_{DD}$ and node 144. The common node between transistors 125 and 127 (line 141) is coupled to $V_{DD}$ through a pull-up transistor 128. Similarly, the common node between transistors 126 and 130 (line 142) is coupled to a pull-up transistor 129. The outputs of the differential amplifier 135 are buffered by two pairs of transistors 125 and 127, and 126 and 130 operating in a push-pull mode. Node 144 is coupled to $V_{DD}$ through a pull-up transistor 131 and to the other input terminal of amplifier 139. The differential amplifier 135 may be a known differential amplifier; in the presently preferred embodiment, the input line 138 is TTL compatible.

The circuit shown in FIG. 7 below node 144 is used to delay the coupling of this node to ground through transistor 124. The potential on this node is shown in FIG. 8 as the address pull-down (APD) signal. As will be discussed, this circuit permits a negative setup time, that is, the address signals applied to the memory need not be valid at the time the chip enable (CE) signal becomes positive. Moreover, this circuit prevents the memory from being sensitive to slow CE rise times.

The gate of transistor 124 is coupled to the common terminal between the series transistors 122 and 123, and to one terminal of the boostrapping capacitor 137. The other terminal of the bootstrapping capacitor 137 is coupled to the gate of transistor 122 and to the source terminal of transistor 121. The gate of transistor 123 is coupled through transistor 120 to the common terminal between series transistors 118 and 119. The drain terminals of transistors 118 and 122 along with the gates of transistors 120 and 122 are coupled to $V_{DD}$. The gates of transistors 119 and 121 are coupled to the source of the CE signal; the gate of transistor 118 receives the $\overline{CE}$ signal.

When the $\overline{CE}$ signal is positive, transistor 118 conducts and the common node between transistors 118 and 119 (including the gate of transistor 123) are charged to $V_{DD}$ less the threshold drop of transistor 118. As the CE signal becomes positive, transistor 119 conducts causing the charge on the gate of transistor 123 to discharge through transistors 119 and 120. However, before sufficient charge is removed from this gate to prevent conduction of transistor 123, capacitor 137 is charged through transistors 121 and 123. When the potential on the gate of transistor 123 drops sufficiently to prevent transistor 123 from conducting, the potential on the gate of transistor 124 rises since it is coupled to $V_{DD}$ through transistor 122. The gate of transistor 122 is bootstrapped through the capacitor 137 to assure that the potential on the gate of transistor 124 rises to $V_{DD}$. As transistor 124 conducts, node 144 is brought to ground activating the address buffer.

In the presently preferred embodiment of the invention, where CE varies between $V_{DD}$ and ground, node 144 is brought to ground potential after a delay from the line when CE becomes positive. Thus, an address applied to the memory need not be valid until the time that the CE signal is well above threshold. In fact, the system will tolerate CE rise times of approximately 100 nanoseconds. The delay period for coupling node 144 to ground is primarily determined by the capacitance associated with the gate of transistor 123 and the resistance of transistor 120.

A unique feature of the amplifier of FIG. 7 is that the output address line 141 and 142 as well as the gates of the load transistors 127 and 130 are held at $V_{DD}$ less a threshold prior to the time that node 144 is brought to ground potential. During the period of time that $\overline{CE}$ is positive, lines 141 and 142 are coupled to $V_{DD}$ through transistors 128 and 129, respectively, and the gates of transistors 125 and 126 are charged, as are the gates of the load transistors 127 and 130.

For sake of discussion assume that when node 144 is coupled to ground that $A_{IN}$ is low ($A_{IN}=0$). For this condition node 139 and 139A are driven by the differential amplifier 135 to a potential above $V_{DD}$ while node 140 and 140A drops to ground potential. This causes transistor 130 to conduct, heavily, this coupling line 142 to $V_{DD}$. Also, the high potential on node 139 causes transistor 125 to conduct coupling line 141 to ground through transistors 124 and 125. The low potential on node 140 amnd 140A prevents line 142 from being coupled to ground and also prevents transistor 127 from conducting. Similarly, if $A_{IN}$ is high ($A_{IN}=1$) when node 144 is brought to ground potential, transistors 127 and 126 will conduct providing the correct output signal.

$\phi_w$ & SAS GENERATOR

Referring to FIG. 9, the SAS line 27 of the $\phi_w$ and SAS generator is coupled to $V_{DD}$ through pull-up transistor 145 and to ground through the parallel transistors 146 and 147. The gate of transistor 146 is coupled to the source of the "B" signal generator 48 of FIG. 1 through a source follower circuit; this signal is also coupled to the input terminal of a delay amplifier 154. The output of amplifier 154, line 159 is coupled to the gate of transistor 147 and to the input terminal of a $\phi_w$ driver 155. The amplifier 154 amplifies the input signal, moreover this amplifier delays the input signal to provide the time 78 of FIG. 8, as will be explained. Known delay/amplifier means may be employed for amplifier 154.

The $\phi_w$ line 26 is coupled to $V_{DD}$ through parallel transistor 148 and 149, and to ground through parallel transistors 150 and 151. The output of $\phi_w$ driver 155 is coupled to the gate of transistor 148, driver 155 is also coupled to a $\phi_w$ turn-off driver 156; the outout of driver 156 is coupled to the gate of transistor 150. The gate of transistor 149 is driven by the output of a $\phi_w$ driver 157. The input to this driver is the $+w_1$ signal generated by the generator 28 of FIG. 1. Driver 157 is also coupled to a $\phi_w$ turn-off driver 158; the output of this driver is coupled to the gate of transistor 151. Drivers 155 and 157 are used to drive the gates of transistors 148 and 149, respectively, to a potential above $V_{DD}$ in order that line 26 may be brought to $V_{DD}$. Driver 156 and 158 provide delay and drive the gates of transistors 150 and 151, respectively, to bring line 26 to ground. Known circuits may be employed for the drivers 154, 155, 156 and 157.

During the period of time that $\overline{CE}$ is positive, transistor 145 conducts charging line 27 to $V_{DD}$ less a threshold. When the "B" signal becomes positive, line 27 begins to discharge(after a brief delay) through transistor 146. The rate of this discharge (slope 77 of FIG. 8) is determined by the impedance of this transistor; in the presently preferred embodiment the Z/1 ratio of this device is 175/7. The "B" signal after being delayed by amplifier 154 (15 to 20 nanoseconds delay) causes transistor 147 to conduct (at time 78). Transistor 147 also discharges line 27, thereby providing the slope 79 of FIG. 8. In the presently preferred embodiment the Z/1 ratio of this transistor is 1100/7.

For the generation of the $\phi_w$ signal, the signal on line 159 activates transistor 148 through driver 155 to provide the rise in potential on the $\phi_w$ line shown in FIG. 8. Then after approximately 60 nanoseconds transistor 150 conducts to bring line 26 to ground potential. During a read-modify write cycle the $+w_1$ signal through driver 157 causes line 26 to rise again in order that data may be written into the selected memory cell. Transistor 151 then discharges line 26 after approximately 60 nanoseconds.

The above described MOS RAM operates in a manner somewhat similar to other dynamic MOS RAMS with the exceptions noted above. Referring to FIG. 8, after the chip enable (CE) signal becomes positive the address pull-down (APD) signal drops in potential allowing the address buffers to sense and latch an address applied to the memory. Specifically, as discussed in conjunction with FIG. 7, node 144 of the address buffers drops in potential as indicated by the address latch period on the APD waveform of FIG. 8. The output lines of the address buffers then rise and fall to their appropriate levels as indicated by the A/Ā waveforms in FIG. 8. Again as discussed in conjunction with FIG. 7, the output lines of the address buffers are maintained at $V_{DD} - V_{TH}$, one line then rises in potential to $V_{DD}$ while the other line drops to $V_{SS}$. Following this the decoder pull-down (DPD) generator 49 of FIG. 1 couples a signal to the decoders in the array activating these decoders, thereby permitting an address to be decoded. The output of the DPD generator is shown in FIG. 8 along with the decoding period. Then, the output of the "B" generator 48 of FIG. 1 rises in potential permitting selection of a column line by the column decoder 17 of FIG. 1. As previously discussed, the $\phi_w$ and SAS signals then activate the sense amplifiers 16 and one of the bit-sense lines is coupled to one of the two input/output lines as the output potential of the "C" generator 29 rises. Information is thus read from a memory cell and sensed at the memory output line 43.

If information is to be written into the array the write enable generator 28 along with the input on the data line 52 causes the push-pull buffer 45 to place the appropriate potential on the selected bit-sense line for storage in the selected cell. As previously mentioned other functions of the memory such as refreshing and read-modified write cycles operate in a well known manner with the exceptions noted above.

Thus, a dynamic MOS RAM has been described which employs storage cells each including a single active n-channel transistor. The memory provides higher speeds at lower power and includes circuits and circuit layouts which reduce the memory's sensitivity to noise.

We claim:

1. A dynamic, metal-oxide-semiconductor (MOS), random-access memory (RAM) comprising:
   a plurality of storage cells disposed along a plurality of bit-sense lines;
   a plurality of bit-sense amplifiers, each of said amplifiers being coupled to one of said bit-sense lines, each bit-sense amplifier including a bistable circuit having a pair of load devices;
   a generator means coupled to said plurality of bit-sense amplifiers for activating said bit-sense amplifiers, said generator means generating an output signal having a first slope for a predetermined period, followed by a second slope at the end of said period, said second slope being greater than said first slope;
   whereby said bit-sense amplifiers ae activated in a manner which provides high noise rejection.

2. The MOS RAM defined by claim 1 including second generator means coupled to said pair of load devices for activating said load devices, said second generator means preventing said load devices from conducting during said predetermined period thereby providing maximum gain at low power consumption during said period.

3. The MOS RAM defined by claim 2 wherein said pair of load devices comprise a pair of field-effect transistors.

4. The MOS RAM defined by claim 3 wherein said second generator means is coupled to the gates of said pair of field-effect transistors and maintains said gates of said transistors at a voltage threshold less than the potential required to cause said transistors to conduct during said predetermined period, and at the end of said period increases said potential on said gates causing said transistors to conduct.

5. THE MOS RAM defined by claim 4 wherin said field-effect transistors comprise n-channel transistors.

6. The MOS RAM defined by claim 1 wherein said generator means coupled to said plurality of bit-sense amplifiers maintains a node of said bistable circuit at the potential used to power said circuit less a voltage threshold of a field-effect transistor, prior to said predetermined period.

7. The MOS RAM defined by claim 5 wherein said bistable circuit is fabricated from a plurality of n-channel field-effect transistors.

8. In a dynamic metal-oxide-semiconductor (MOS), random-access memory (RAM) employing a plurality of memory cells coupled to a plurality of bit-sense lines; input/output means for communicating with said bit-sense lines comprising;
   a first input/output line, said first line coupled to a first group of said bit-sense lines through first decoders, said first decoders selectable for a predetermined address signal;
   a second input/output line, said second line coupled to a second group of said bit-sense lines through second decoders, said second decoders selectable with the complement of said pre-determined address signal;
   a first load means selectively coupled to said first input/output line when one of said second decoders is selected;
   a second load means selectively coupled to said second input/output line when one of said first decoders is selected; and
   an output buffer coupled to said first and second input/output lines;
   whereby one of said input/output lines may be coupled to a load when data is being communicated on the other of said input/output lines.

9. The MOS RAM defined by claim 8 wherein each of said first and second load means includes capacitance means.

10. The MOS RAM defined by claim 9 wherein said output buffer includes a bistable circuit.

11. The MOS RAM defined by claim 8 wherein said first group of bit-sense lines comprises alternate successive pairs of said bit-sense lines.

12. The MOS RAM defined by claim 11 including pull-up means for precharging said bit-sense lines.

13. In an address buffer for an MOS memory which includes an input line for receiving an address signal, a first output line for providing an output signal representative of said address signal, and a second output line for providing an output signal representative of the complement of said address signal; an improvement comprising:

means for maintaining said first and second output lines at a predetermined potential before said address signal is applied to said buffer; and means for discharging one of said first and second output lines to a potential below said predetermined potential and for raising the potential on the other of said first and second output lines to a potential above said predetermined potential, said discharging and raising of said output lines occuring after said address signal is applied to said buffer;

whereby said buffer as improved response to said address signal.

14. The buffer defined by claim 13 including a bistable circuit.

15. The buffer defined by claim 14 wherein said bistable circuit includes a first and second transistor, said first transistor being coupled between a source of a power potential and said first output line, and said second transistor being coupled between said source of a power potential and said second output line.

16. The buffer defined by claim 15 wherein said predetermined potential is a voltage threshold below said power potential.

17. The buffer defined by claim 16 including means for maintaining the gates of said first and second transistors at said predetermined potential before said address signal is applied to said buffer.

18. The buffer defined by claim 17 including pull-up transistors coupled between said source of said power potential and said first and second output lines for charging said lines to said predetermined potential.

19. The buffer defined by claim 18 whererin said buffer includes n-channel, field-effect transistors.

20. The buffer defined by claim 13 including circuit means for delaying activation of said buffer after a control signal is applied to said circuit means whereby said address signal may follow, in time, said control signal.

21. The buffer defined by claim 20 wherein said circuit means is responsive to the rise time of said control means.

22. The buffer means defined by clalim 21 wherein said circuit means couples a bistable circuit in said buffer to ground potential to activate said buffer.

23. In an MOS bootstrapping circuit raising the potential on the gate of an output transistor to a potential greater than the power supply potential by means of a first capacitor coupled to said gate of said output transistor, an improvement comprising:

a transfer transistor coupled between said first capacitor and a source of a selectively applied potential;

a second capacitor coupled between the gate of said transfer transistor and said source of said selectively applied potential; and, charging means for charging said second capacitor before the application of said selectively applied potential;

whereby said selectively applied potential, through bootstrapping of said gate of said transfer transistor by said second capacitor, charges said first capacitor to said power supply potential, thereby permitting increased bootstrapping of said gate of said output transistor.

24. The improved bootstrapping circuit defined by claim 23 including discharging means for discharging said gate of said transfer transistor when the output of said output transistor rises.

* * * * *

UNITED STATES PATENT OFFICE
CERTIFICATE OF CORRECTION

Patent No. 4,038,646     Dated July 26, 1977

Inventor(s) Rustam Mehta et al.

It is certified that error appears in the above-identified patent and that said Letters Patent are hereby corrected as shown below:

Column 1, line 34, "moise" should read -- noise --.

Column 3, line 9, "fieldeffect" should read -- field-effect --.

Column 3, line 43, "an" should read -- and --.

Column 3, line 56, "64" should read -- sixty-four --.

Column 4, line 10, after "bit-sense" add -- line --.

Column 7, line 36, "coupled L/O" should read -- coupled to I/O --.

Column 7, line 45, "$A_7$" should read -- $\overline{A_7}$ --.

Column 9, line 10, "reuired" should read -- required --.

Signed and Sealed this

Thirteenth Day of December 1977

[SEAL]

Attest:

RUTH C. MASON
*Attesting Officer*

LUTRELLE F. PARKER
*Acting Commissioner of Patents and Trademarks*